United States Patent
Gai et al.

(10) Patent No.: US 9,960,222 B2
(45) Date of Patent: May 1, 2018

(54) OLED ARRAY SUBSTRATE, DISPLAY APPARATUS CONTAINING THE SAME, AND METHOD FOR FORMING THE SAME

(71) Applicant: BOE TECHNOLOGY GROUP CO., LTD, Beijing (CN)

(72) Inventors: Cuili Gai, Beijing (CN); Zhongyuan Wu, Beijing (CN); Longyan Wang, Beijing (CN); Xingdong Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 44 days.

(21) Appl. No.: 15/031,250

(22) PCT Filed: Sep. 17, 2015

(86) PCT No.: PCT/CN2015/089835
§ 371 (c)(1),
(2) Date: Apr. 21, 2016

(87) PCT Pub. No.: WO2016/155257
PCT Pub. Date: Oct. 6, 2016

(65) Prior Publication Data
US 2017/0104051 A1    Apr. 13, 2017

(30) Foreign Application Priority Data
Mar. 30, 2015   (CN) .......................... 2015 1 0146172

(51) Int. Cl.
*H01L 27/32*    (2006.01)
*H01L 51/52*    (2006.01)
(Continued)

(52) U.S. Cl.
CPC ...... *H01L 27/3276* (2013.01); *H01L 51/0021* (2013.01); *H01L 51/5228* (2013.01); *H01L 51/56* (2013.01); *H01L 2227/323* (2013.01)

(58) Field of Classification Search
None
See application file for complete search history.

(56) References Cited

U.S. PATENT DOCUMENTS 9,000,428 B2 *  4/2015  Lee ...................... H01L 27/3272
                                                                257/40
9,640,097 B2 *  5/2017  Cai ...................... G09G 3/3233
(Continued)

FOREIGN PATENT DOCUMENTS

CN     101226953 A    7/2008
CN     102903733 A    1/2013
(Continued)

OTHER PUBLICATIONS

State Intellectual Property Office of the P.R.C. (SIPO) Office Action 1 for 201510146172.4 dated Mar. 3, 2017 9 Pages.

*Primary Examiner* — Michelle Mandala
(74) *Attorney, Agent, or Firm* — Anova Law Group, PLLC (57) ABSTRACT

The present disclosure provides an organic light-emitting diode (OLED) array substrate. The OLED array substrate includes a display area with OLEDs arranged in arrays, electrostatic discharge lines, and peripheral electrostatic discharge areas with conductive areas electrically connected to a cathode of the OLEDs and electrically connected to the electrostatic discharge lines through switch modules.

16 Claims, 7 Drawing Sheets

(51) Int. Cl.
*H01L 51/56* (2006.01)
*H01L 51/00* (2006.01)

(56) References Cited

U.S. PATENT DOCUMENTS

| | | |
|---|---|---|
| 2008/0170013 A1 | 7/2008 | Jeong et al. |
| 2014/0185169 A1 | 7/2014 | Jung et al. |
| 2016/0098953 A1* | 4/2016 | Ko ........................ G09G 3/3208 345/76 |

FOREIGN PATENT DOCUMENTS

| | | |
|---|---|---|
| CN | 203338721 U | 12/2013 |
| CN | 103913865 A | 7/2014 |
| CN | 104716165 A | 6/2015 |

* cited by examiner

OLED ARRAY SUBSTRATE, DISPLAY APPARATUS CONTAINING THE SAME, AND METHOD FOR FORMING THE SAME

CROSS-REFERENCES TO RELATED APPLICATIONS

This application is a national phase entry under 35 U.S.C. § 371 of International Application No. PCT/CN2015/089835, filed on Sep. 17, 2015, which claims priority to Chinese Patent Application No. 201510146172.4, filed on Mar. 30, 2015 The above enumerated patent applications are incorporated by reference herein in their entirety.

FIELD OF THE INVENTION

The present invention generally relates to the display technologies and, more particularly, relates to an OLED array substrate, display apparatus containing the same, and method for forming the same.

BACKGROUND

An Organic Light-Emitting Diode (OLED) display panel includes an array substrate or a Thin-Film Transistor (TFT) substrate. As a key component of the OLED display panel, the performance of the array substrate is crucial to the display panel.

In the process of forming/depositing the cathode of an OLED display panel, an undesirably amount of electrostatic charges may be generated. The electrostatic charges may cause serious damage to the circuit on the array substrate. Certain defects may also be formed in the display panel.

Current array substrates may be susceptible to damages caused by electrostatic charges, which may lead to short circuits on the display panel.

BRIEF SUMMARY OF THE DISCLOSURE

The present invention addresses the above problems in the prior art. The present disclosure provides an OLED array substrate, the method for manufacturing the OLED array substrate, and the display apparatus containing the OLED array substrate to reduce damages caused by the electrostatic charges generated during the cathode deposition process.

One aspect of the present disclosure includes an organic light-emitting diode (OLED) array substrate. The OLED array substrate includes a display area with OLEDs arranged in arrays, electrostatic discharge lines, and peripheral electrostatic discharge areas with conductive areas electrically connected to a cathode of the OLEDs and electrically connected to the electrostatic discharge lines through switch modules.

Optionally, the switch modules are configured to form electrical connection between the conductive areas and the electrostatic discharge lines under an electrostatic voltage generated by electrostatic charges.

Optionally, the electrostatic discharge lines include high-voltage electrostatic discharge lines and low-voltage electrostatic discharge lines; and a conductive area is connected to a high-voltage electrostatic discharge line through first switch modules, and is connected to a low-voltage electrostatic discharge line through second switch modules.

Optionally, when positive electrostatic charges are generated in the conductive area and create a positive electrostatic voltage, the first switch modules are turned on; and when negative electrostatic charges are generated in the conductive area and create a negative electrostatic voltage, the second switch modules are turned on.

Optionally, a control terminal and a first terminal of the first switch module are connected to the conductive area; and a second terminal of the first switch module is connected to the high-voltage electrostatic discharge line.

Optionally, a control terminal and a first terminal of the second switch module are connected to the low-voltage electrostatic discharge line, and a second terminal of the second switch module is connected to the conductive area.

Optionally, the first switch modules and the second switch modules are N-type transistors.

Optionally, a control terminal and a first terminal of the first switch module are connected to the high-voltage electrostatic discharge line, and a second terminal of the first switch module is connected to the conductive area.

Optionally, a control terminal and a first terminal of the second switch module are connected to the conductive area, and a second terminal of the second switch module is connected to the low-voltage electrostatic discharge line.

Optionally, the first switch modules and the second switch modules are P-type transistors.

Optionally, the switch module includes at least two cascaded transistors.

Optionally, the OLED array substrate further includes gate lines and data lines arranged to be perpendicular to the gate lines, wherein gate lines and data lines are connected to the low-voltage electrostatic discharge line through a first electrostatic discharge structure and are connected to the high-voltage electrostatic discharge line through a second electrostatic discharge structure.

Another aspect of the present disclosure provides an OLED display apparatus. The OLED display apparatus includes any one of the disclosed OLED array substrates.

Another aspect of the present disclosure provides a method for forming an OLED array substrate. The method includes forming switch modules electrically connected to conductive areas and electrostatic discharge lines; and forming, subsequently, a cathode of OLEDs in the array substrate, wherein the conductive areas are connected to the cathode such that during a process for forming the cathode of the OLEDs, electrostatic voltages generated by electrostatic charges in the conductive areas turn on the switch modules and the electrostatic charges are discharged through the electrostatic discharge lines.

Another aspect of the present disclosure provides an electrostatic discharge circuit for discharging electrostatic charges generated during a formation process of a cathode layer of an organic light-emitting diode (OLED) array substrate. The electrostatic discharge circuit includes electrostatic discharge lines, peripheral electrostatic discharge areas with conductive areas, the conductive areas being electrically connected to the cathode layer, and switch modules connecting the conductive areas and the electrostatic discharge lines, wherein the electrostatic charges in the conductive areas are discharged through the switch modules and electrostatic discharge lines.

Optionally, the switch modules are configured to be turned on by electrostatic voltages generated by electrostatic charges in the conductive areas such that the electrostatic charges are discharged through the electrostatic discharge lines.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure. It should be noted that the disclosed drawings only illustrate portions of the array substrate that are related to the electrostatic discharge for illustrative purposes.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts. It should be noted that the terms "first" and "second" are used to merely distinguish two objects and have little indication about the differences in structures and components between two objects.

One aspect of the present disclosure provides an OLED array substrate.

Figure 1:
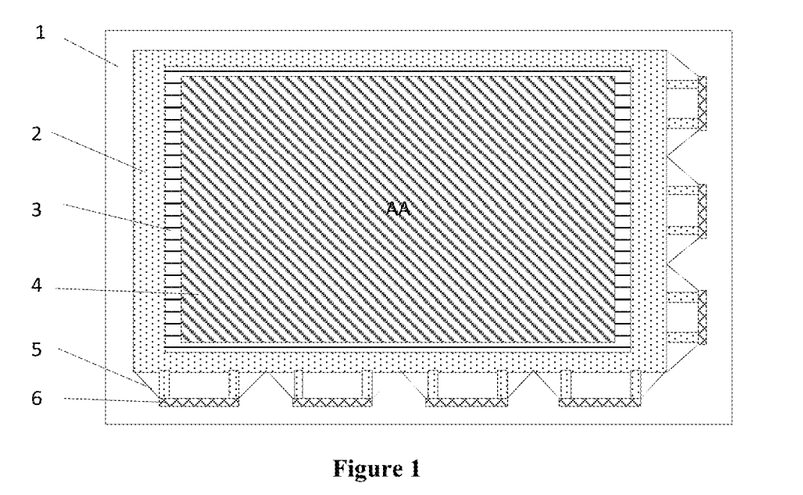
FIG. 1 illustrates an exemplary OLED array substrate according to the disclosed embodiments of the present disclosure.

The disclosed OLED array substrate can be exemplified in embodiment 1. FIG. 1 illustrates the structure of an exemplary OLED array substrate of the present disclosure. In FIG. 1, 1 may represent a glass substrate, 2 may represent peripheral electrostatic discharge areas, 3 may represent electrostatic discharge wiring areas, 4 may represent the active area (AA) or display area, 5 may represent fan-out wiring areas, and 6 may represent chip on film (COF) binding areas. As shown in FIG. 1, the OLED array substrate exemplified in embodiment 1 may include the display area 4 and peripheral electrostatic discharge areas 2, and the display area 4 may include OLEDs arranged in arrays. The peripheral electrostatic discharge areas 2 may include conductive areas electrically connected to the cathode of the OLEDs. The main portion of the electrostatic discharge areas 2 may be conductive areas. The electrostatic discharge areas 2 may include patterned metal and indium tin oxide (ITO). The metal can be any suitable metal for electrostatic discharge areas 2 such as Al. The OLED array substrate may also include electrostatic discharge lines or circuit arranged in the electrostatic discharge wiring areas 3 in FIG. 1 (not shown). The conductive areas may be connected to the electrostatic discharge lines through switch modules arranged in the electrostatic discharge wiring areas 3 in FIG. 1 (not shown). The electrostatic voltage generated by the electrostatic charges in the conductive areas may turn on the switch modules so that the electrostatic charges generated in the conductive areas may be discharged through the electrostatic discharge lines.

Figure 2:
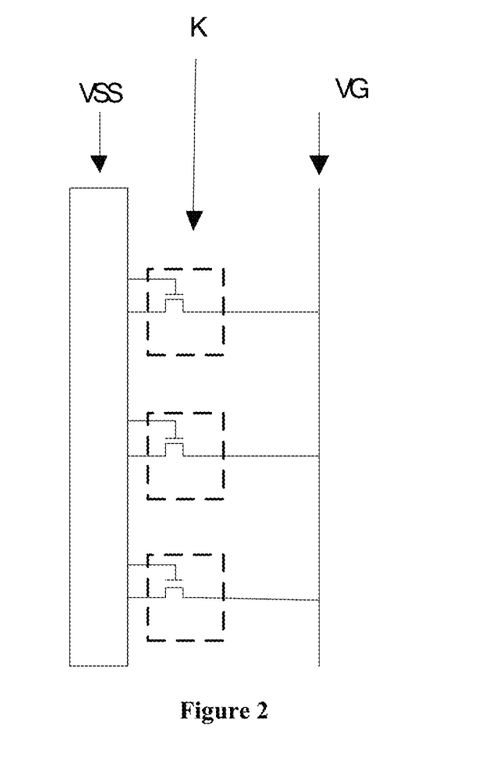
FIG. 2 illustrates an exemplary circuit of a conductive area, electrostatic discharge lines, and switch modules according to the disclosed embodiments of the present disclosure.

FIG. 2 illustrates an exemplary connection of a conductive area, the electrostatic discharge lines, and the switch module. As shown in FIG. 2, the conductive area VSS may be connected to the electrostatic discharge line VG through a switch module K. Electrostatic charges generated in the conductive area may turn on the switch modules K such that the electrostatic charges generated in the conductive area VSS may be discharged through the electrostatic discharge line VG.

Figure 8:
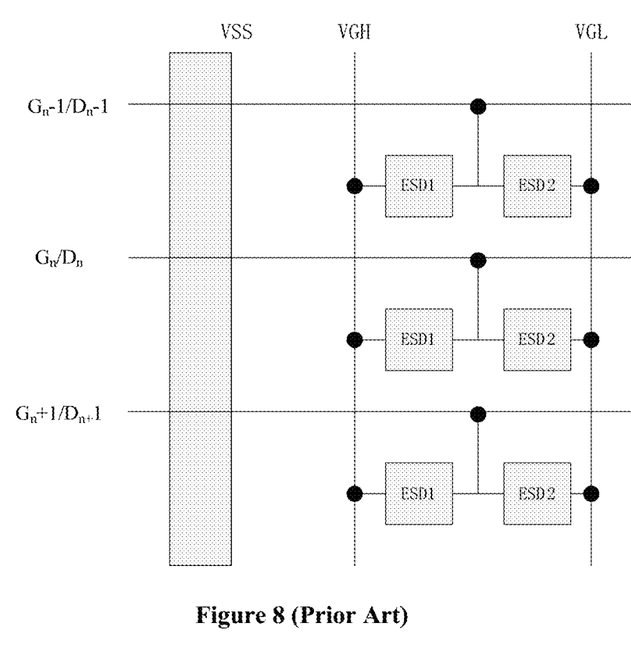
FIG. 8 illustrates existing circuit of gate lines/data lines, a conductive area, high-voltage electrostatic discharge lines, low-voltage electrostatic discharge lines, third switch modules, and fourth switch modules.

In FIG. 2, the portions circled in dashed lines may be the added switch modules K, as compared to an existing OLED array substrate illustrated in FIG. 8, which does not place a switch module between the conductive area VSS and the electrostatic discharge lines. For illustrative purposes, FIG. 2 only shows three switch modules K. It should be noted that the number of the switch modules K may be determined according to various applications and is not limited by the explicitly disclosed embodiments of the present disclosure. For example, one or more switch modules K can be included/added. The conductive areas VSS may be often arranged in opposing positions of the OLED array substrate, and the switch modules K may be arranged between each of the conductive area and a corresponding electrostatic discharge line VG to improve discharge performance.

The conductive areas VSS may represent the areas electrically connected to the subsequently-formed (e.g., subsequently-deposited) cathode of the OLEDs. When the cathode of the OLEDs is being formed, an undesirably large amount of electrostatic charges may be generated such that circuit near the conductive areas may be damaged and short circuits may occur. Normal display functions of the corresponding display panel may therefore be adversely affected.

In the OLED array substrate provided by the present disclosure, switch modules may be arranged between conductive areas and electrically connected to the cathode of the OLEDs and the electrostatic discharge lines. Thus, when electrostatic charges are generated in the conductive areas, for example, during the deposition of the cathode of the OLEDs, the electrostatic charges may turn on the switch modules and the generated electrostatic charges may be discharged through the electrostatic discharge lines. Damages to the array substrate caused by electrostatic charges may be avoided or reduced, and manufacturing yield of the display products can be improved.

Figure 3A:
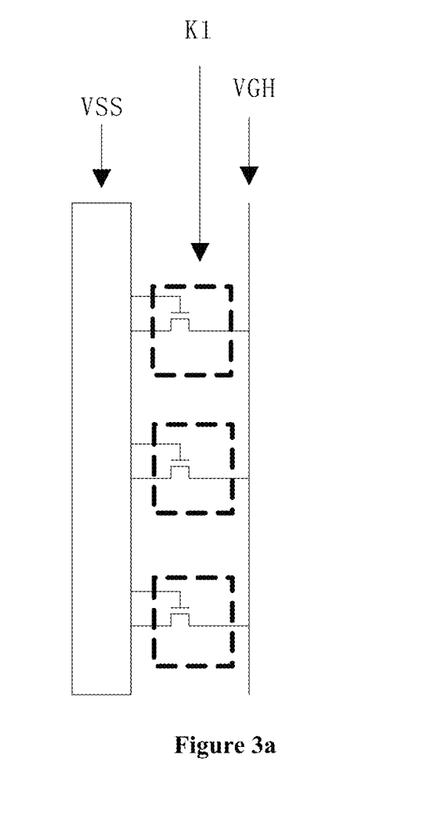
FIG. 3a illustrates an exemplary circuit of a conductive area, high-voltage electrostatic discharge lines, and first switch modules (N-type transistors) according to the disclosed embodiments of the present disclosure.
Figure 3B:
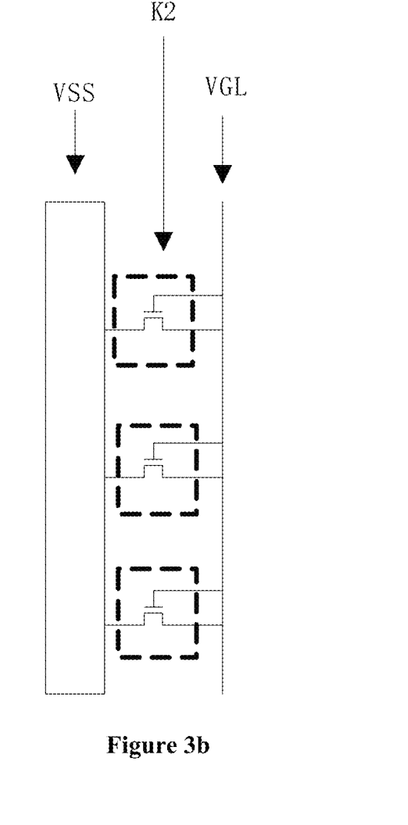
FIG. 3b illustrates an exemplary circuit of a conductive area, low-voltage electrostatic discharge lines, and second switch modules (N-type transistors) according to the disclosed embodiments of the present disclosure.
Figure 4A:
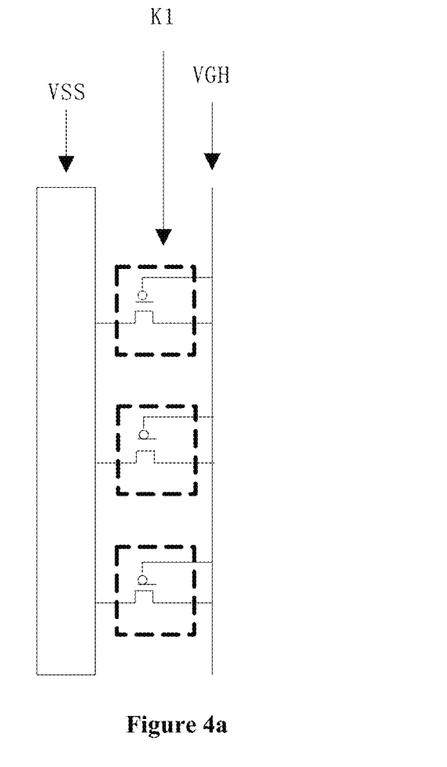
FIG. 4a illustrates another exemplary circuit of a conductive area, high-voltage electrostatic discharge lines, and first switch modules (P-type transistors) according to the disclosed embodiments of the present disclosure.
Figure 4B:
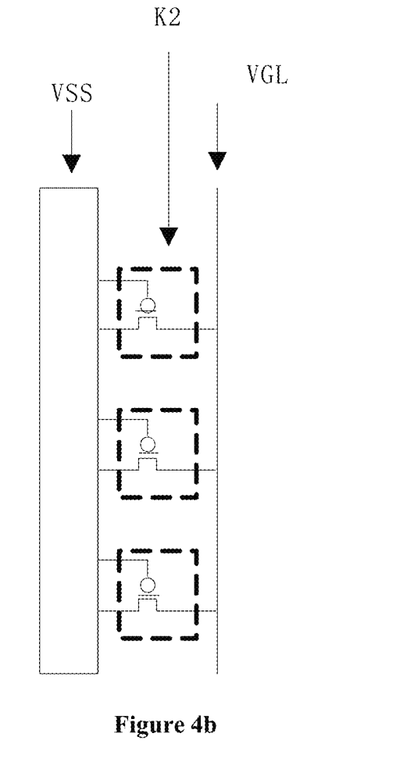
FIG. 4b illustrates another exemplary circuit of a conductive area, low-voltage electrostatic discharge lines, and second switch modules (P-type transistors) according to the disclosed embodiments of the present disclosure.

The disclosed OLED array substrate can also be exemplified in embodiment 2. The array substrate in FIG. 3a illustrates the circuit of a conductive area, a high-voltage electrostatic discharge line, and first switch modules (N-type transistor). FIG. 3b illustrates the circuit of a conductive area, a low-voltage electrostatic discharge line, and second switch modules (N-type transistor). FIG. 4a illustrates the circuit of a conductive area, a high-voltage electrostatic discharge line, and first switch modules (P-type transistor). FIG. 4b illustrates the circuit of a conductive area, a low-voltage electrostatic discharge line, and second switch modules (P-type transistor).

Different from embodiment 1, in embodiment 2, the electrostatic discharge lines (i.e., corresponding to VG in FIG. 2) may include a high-voltage electrostatic discharge line VGH and a low-voltage electrostatic discharge line VGL. A conductive area VSS may be connected to the high-voltage electrostatic discharge line VGH through the first switch modules K1, as shown in FIGS. 3a and 4a. The conductive VSS may also be connected to the low-voltage electrostatic discharge line VGL through the second switch modules K2, as shown in FIGS. 3b and 4b. When the conductive area VSS generates positive electrostatic voltage, the first switch modules K1 may be turned on, and when the conductive area VSS generates negative electrostatic voltage, the second switch modules K2 may be turned on.

The first switch module K1 may include N-type transistors and/or P-type transistors. The second switch module K2 may also include N-type transistors and/or P-type transistors.

For example, a first switch module K1 may include at least two cascaded N-type transistors or at least two cascaded P-type transistors. A second switch module K2 may also include at least two cascaded N-type transistors or at least two cascaded P-type transistors. The threshold voltages of the cascaded transistors may be increased such that devices or circuits may be protected from undesirably high leakage currents.

In certain embodiments of the present disclosure, a conductive area VSS may be connected to both the high-voltage electrostatic discharge line VGH and the low-voltage electrostatic discharge line VGL. First switch modules K1 may be used to connect the conductive area VSS with the high-voltage electrostatic discharge line VGH. Second switch modules K2 may be used to connect the conductive area VSS with the low-voltage electrostatic discharge line VGL. Details of the working principles of the arrangements described above are aforementioned and omitted herein.

Figure 5:
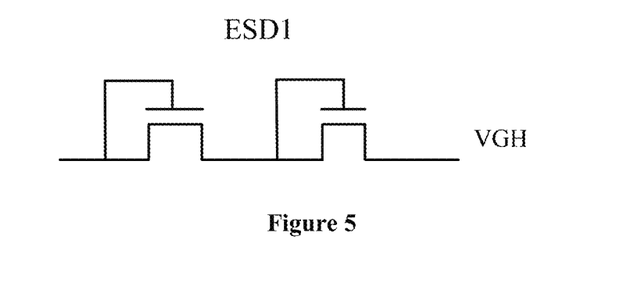
FIG. 5 illustrates an exemplary first switch module according to the disclosed embodiments of the present disclosure.

For example, FIG. 5 illustrates an first electrostatic discharge structure ESD1 connected to a first switch module K1. ESD 1 may include two cascaded N-type transistors. The two cascaded N-type transistors may be connected to a conductive area VSS on the left side and connected to the high-voltage electrostatic discharge line VGH on the right side. When no electrostatic charges are in the conductive area VSS, the voltage on the left side of the two cascaded N-type transistors may be lower than the voltage provided by the high-voltage electrostatic discharge line VGH. The two cascaded N-type transistors are turned off (i.e., functioning as open circuit). When the conductive area VSS generates positive high-voltage electrostatic charge, the voltage on the left side of the two cascaded N-type transistors may instantaneously be higher than the voltage provided by the high-voltage electrostatic discharge line VGH. The two cascaded N-type transistors may be turned on such that the electrostatic charges generated in the conductive area VSS may be discharged through the high-voltage electrostatic circuit VGH.

Figure 6:
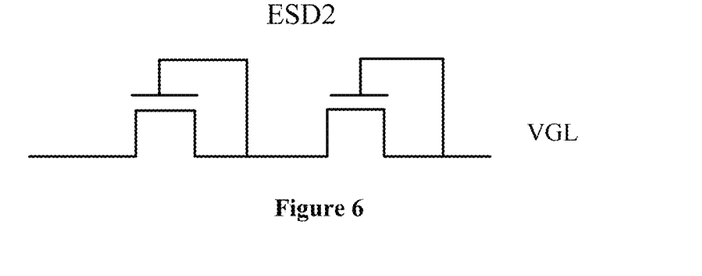
FIG. 6 illustrates an exemplary second switch module according to the disclosed embodiments of the present disclosure.

FIG. 6 illustrates a second electrostatic discharge structure ESD2 connected to a second switch module K2. ESD2 may include two cascaded N-type transistors. The two cascaded N-type transistors may be connected to a conductive area VSS on the left side and connected to the low-voltage electrostatic discharge line VGL on the right side. When no electrostatic charges is in the conductive area VSS, the voltage on the left side of the two cascaded N-type transistors may be higher than the voltage provided by the low-voltage electrostatic discharge line VGL. The two cascaded N-type transistors are turned off (i.e., functioning as open circuit). When the conductive area VSS generates negative high-voltage electrostatic charge, the voltage on the left side of the two cascaded N-type transistors may instantaneously be lower than the voltage provided by the low-voltage electrostatic discharge line VGL. The two cascaded N-type transistors may be turned on such that the electrostatic charges generated in the conductive area may be discharged through the low-voltage electrostatic circuit VGL.

FIGS. 3a and 3b show circuits of the first switch module K1 including N-type transistors and the second switch module K2 including N-type transistors. As shown in FIG. 3a, the control terminal and the first terminal of the first switch module K1 may be connected to the conductive area VSS. The second terminal of the first switch module K1 may be connected to the high-voltage electrostatic discharge line VGH. As shown in FIG. 3b, the control terminal and the first terminal of the first switch module K2 may be connected to the low-voltage electrostatic discharge line VGL. The second terminal of the second switch module K2 may be connected to the conductive area VSS.

FIGS. 4a and 4b show circuits of the first switch module K1 including P-type transistors and the second switch module K2 including P-type transistors. As shown in FIGS. 4a, the control terminal and the first terminal of the first switch module K1 may be connected to the high-voltage electrostatic discharge line VGH. The second terminal of the first switch module K1 may be connected to the conductive area VSS.

As shown in FIG. 4b, the control terminal and the first terminal of the second switch module K2 may be connected to the conductive area VSS. The second terminal of the second switch module K2 may be connected to the low-voltage electrostatic discharge line VGL.

In the embodiments disclosed herein, the control terminal may be the gate of a transistor. The first terminal may be the source of a transistor and the second terminal may be the drain of the transistor. Alternatively, the first terminal may be the drain of a transistor and the second terminal may be the source of the transistor.

During the process of forming or depositing the cathode of the OLEDs, if positive high-voltage electrostatic charges are generated, the first switch modules K1 illustrated in FIGS. 3a and 4a may be turned on. The generated positive high-voltage electrostatic charges may be discharged through the high-voltage electrostatic line VGH. If negative high-voltage electrostatic charges are generated, the second switch modules K2 illustrated in FIG. 3b or 4b may be turned on. The generated negative high-voltage electrostatic charges may be discharged through the low-voltage electrostatic line VGL. Accordingly, high-voltage electrostatic charges can be discharged and released, and damages to the array substrate can be reduced.

It should be noted that when positive high-voltage electrostatic charges and/or negative high-voltage electrostatic charges are generated by other processes, the first switch modules K1 and the second switch modules K2 may still be turned on or off under the same working principles. The high-voltage electrostatic charges may be discharged, and damages to the array substrate can be reduced.

The switch modules K1 and K2 illustrated in FIGS. 3a and 3b may each be arranged on the opposing side of each other on the display panel (e.g., left side and right side). The switch modules K1 and K2 illustrated in FIGS. 4a and 4b may each be arranged on the opposing side of each other on the display panel (e.g., top side and bottom side). Alternatively, the first switch modules K1 illustrated in FIGS. 3a and 4a may each be arranged on the opposing side of each other on the display panel (e.g., left side and right side). The second switch modules K2 illustrated in FIGS. 3b and 4b may each be arranged on the opposing side on the display panel (e.g., top side and bottom side).

Figure 7A:
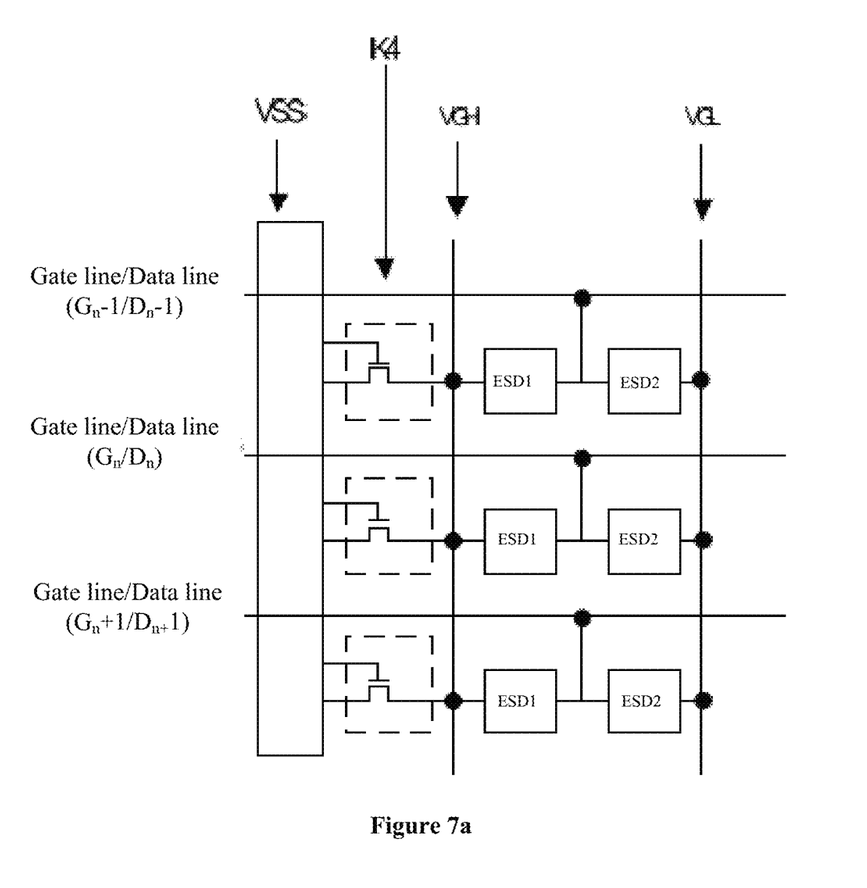
FIG. 7a illustrates an exemplary circuit of gate lines/data lines, a conductive area, high-voltage electrostatic discharge lines, low-voltage electrostatic discharge lines, and third switch modules according to the disclosed embodiments of the present disclosure.
Figure 7B:
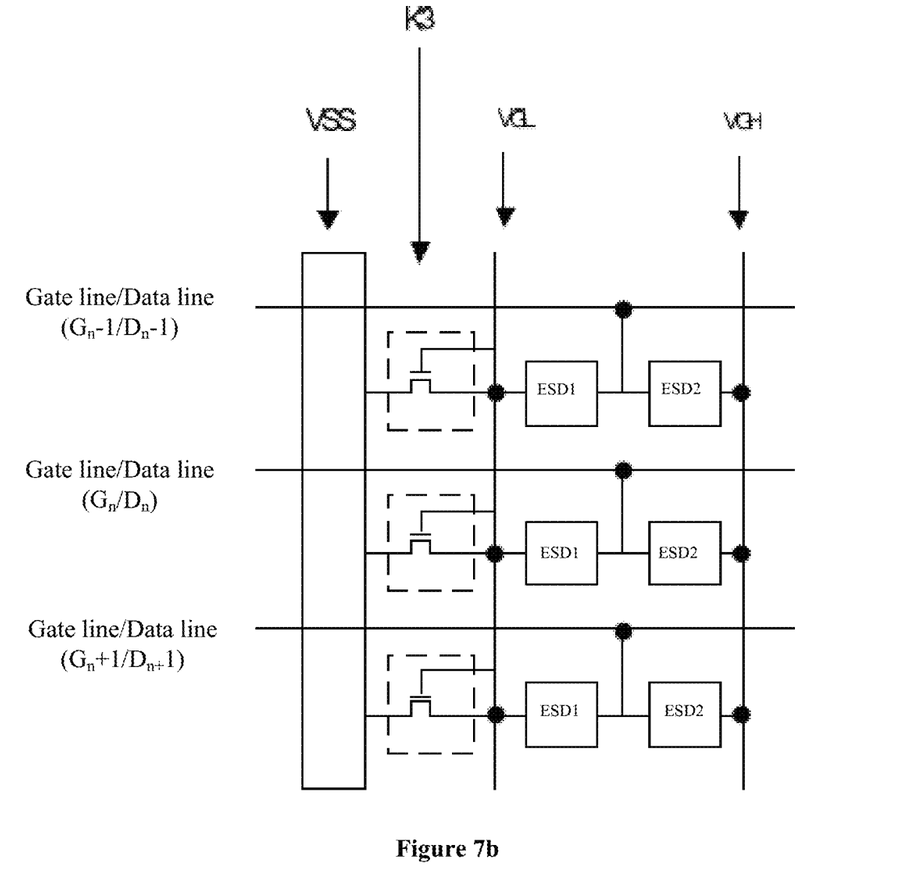
FIG. 7b illustrates another exemplary circuit of gate lines/data lines, a conductive area, high-voltage electrostatic discharge lines, low-voltage electrostatic discharge lines, and third switch modules according to the disclosed embodiments of the present disclosure.

The disclosed OLED array substrate can also be exemplified in embodiment 3. FIG. 7a illustrates a circuit of gate lines/data lines, a conductive area, high-voltage electrostatic discharge lines, low-voltage electrostatic discharge lines, third switch modules, and fourth switch modules. FIG. 7b illustrates another circuit of gate lines/data lines, a conductive area, high-voltage electrostatic discharge lines, low-voltage electrostatic discharge lines, third switch modules, and fourth switch modules.

Besides the features illustrated in embodiment 1, the OLED array substrate of embodiment 3 may further include gate lines and data lines. For illustrative purposes, in the figures provided by the present disclosure, gate lines and data lines may be arranged in similar configurations. In practice, gate lines may be parallel to each other and may be arranged to be perpendicular to the data lines (not shown). Each gate line may be electrically insulated from other gate lines and any data lines, and each data line may be electrically insulated from other data lines and any gate lines. A gate/data line may be connected to the low-voltage electrostatic discharge line VGL through the first electrostatic discharge structure ESD1, and may be connected to the high-voltage electrostatic discharge line VGH through the second electrostatic discharge structure ESD2.

For illustrative purposes, in embodiment 3, the third switch modules K3 and the fourth switch modules K4 both include N-type transistors.

In FIGS. 7a and 7b, $G_n-1$, $G_n$, and $G_n+1$ may each represent the $(n-1)^{th}$ gate line, the $n^{th}$ gate line, and the $(n+1)^{th}$ gate line, respectively. $D_n-1$, $D_n$ and $D_n+1$ may each represent the $(n-1)^{th}$ data line, the $n^{th}$ data line, and the $(n+1)^{th}$ data line, respectively. Before the deposition process to form the cathode of the OLEDs, no voltage is applied on the circuit on the array substrate, and the transistors arranged in arrays are turned off. During the deposition process, if the conductive area VSS generates positive high-voltage electrostatic charges, the fourth switch modules K4 in FIG. 7a may be turned on. The generated positive high-voltage electrostatic charges may be discharged through the high-voltage electrostatic discharge line VGH. If the conductive area VSS generates negative high-voltage electrostatic charge, the third switch modules K3 may be turned on. The generated negative high-voltage electrostatic charges may be discharged through the low-voltage electrostatic discharge line VGL. Thus, high-voltage electrostatic charges can be discharged or released, and damages to the array substrate can be avoided or reduced.

The third switch module K3 and the fourth switch module K4 may have similar structures as the first switch module K1 and the second switch module K2. Detailed description of the structures are omitted herein. In FIG. 7a, the portions circled in dashed lines may be the added switch modules K4, as compared to an existing OLED array substrate illustrated in FIG. 8, which does not place a switch module between the conductive area VSS and the discharge lines VGH.

The design and arrangements described in FIGS. 7a and 7b may each be placed on two opposing sides of the display panel. For example, the design described in FIGS. 7a and 7b may each be arranged on the top side and on the bottom side of the display panel, or on the left side and on the right side of the display panel. Alternatively, the design described in FIG. 7a may be arranged on two opposing sides of the display panel. The design described in FIG. 7b may be arranged on the other two opposing sides of the display panel. For example, the design described in FIG. 7a may be arranged on the left side and the right side of the display panel. The design described in FIG. 7b may be arranged on the top side and the bottom side of the display panel, or vice versa. The specific arrangements of the circuit may be determined according to different applications and are thus not limited by the disclosed embodiments herein.

Figure 9:
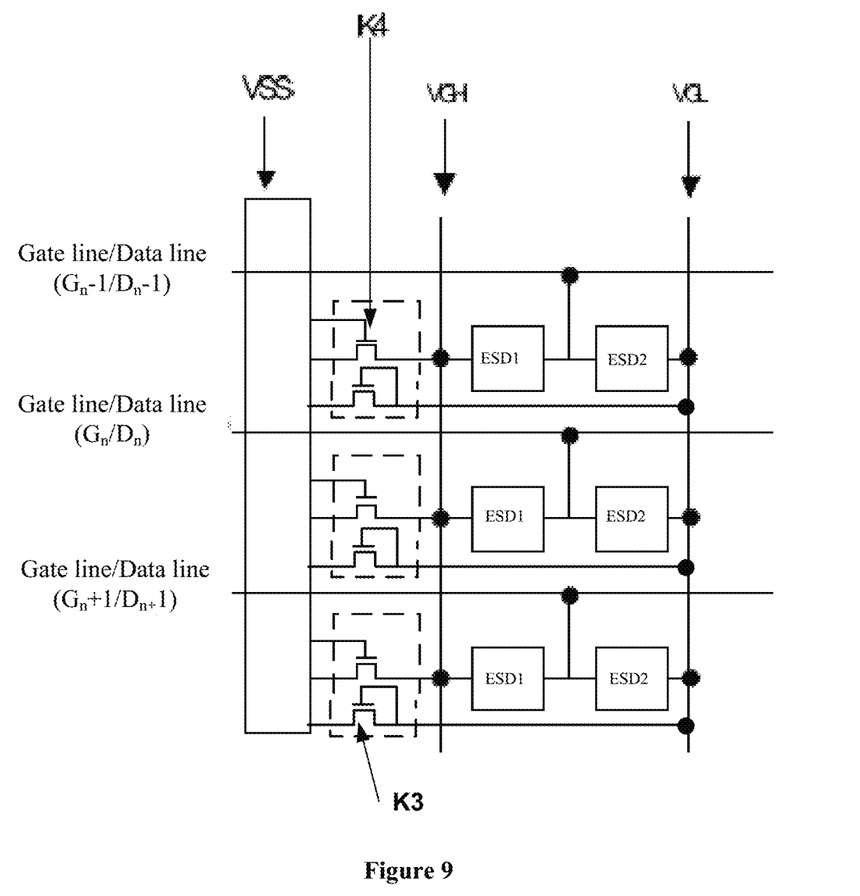
FIG. 9 illustrates another exemplary circuit of gate lines/data lines, a conductive area, high-voltage electrostatic discharge lines, low-voltage electrostatic discharge lines, third switch modules, and fourth switch modules according to the disclosed embodiments of the present disclosure.

In various embodiments, the third switch module K3 and the fourth switch module K4 may both be used in the circuit to discharge positive high-voltage electrostatic charges and negative high-voltage electrostatic charges, as shown in FIG. 9.

Another aspect of the present disclosure provides an OLED display apparatus.

The disclosed OLED display apparatus may be exemplified in embodiment 4. The OLED display apparatus illustrated by embodiment 4 may include any one of the OLED array substrates disclosed in embodiments 1 to 3. It should be noted that the display apparatus may be any suitable electronic device with display functions such as a TV, a monitor, a tablet, a video camera, a camera, or a navigator.

Another aspect of the present disclosure provides a method for manufacturing the disclosed OLED array substrate.

The disclosed method may be exemplified in embodiment 5. The OLED array substrate illustrated by embodiment 5 may include a display area and peripheral electrostatic discharge areas. The display area includes OLEDs arranged in arrays. The peripheral electrostatic discharge areas include conductive areas electrically connected to the cathode of the OLEDs. The OLED array substrate also includes electrostatic discharge lines.

The method for manufacturing the OLED array substrate includes the following steps. First, before forming the cathode of the OLEDs, the switch modules, configured to electrically connect the electrostatic discharge lines and the conductive areas of the display panel, may be formed. The conductive areas may be used to electrically connect the subsequently-formed cathode of the OLEDs on the display panel. Thus, when the cathode of the OLEDs is being formed, the electrostatic voltage, generated in the conductive areas, may turn on the switch modules. The generated electrostatic charges may be discharged through the electrostatic discharge lines.

In the method described above, switch modules, configured to electrically connect the electrostatic discharge lines and the conductive areas of the display panel, are formed before the formation of the cathode of the OLEDs. The conductive areas may be used to electrically connect the subsequently-formed cathode of the OLEDs on the display panel. Thus, the electrostatic voltage generated by the electrostatic charges may turn on the switch modules such that the electrostatic charges may be discharged through the electrostatic discharge lines. Thus, damages to the array substrate caused by the electrostatic charges generated during the deposition of the cathode of the OLEDs, can be avoided or reduced, which may improve manufacturing yield of the display panels.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An organic light-emitting diode (OLED) array substrate, including:
   a display area with OLEDs arranged in arrays;
   electrostatic discharge lines; and
   peripheral electrostatic discharge areas with conductive areas electrically connected to a cathode of the OLEDs and electrically connected to the electrostatic discharge lines through switch modules,
   wherein at least one of the switch modules includes a transistor including a source terminal and a drain terminal, one of the source terminal and the drain terminal being connected to at least one of the conductive areas, and another one of the source terminal and the drain terminal being connected to at least one of the electrostatic discharge lines.

2. The OLED array substrate according to claim 1, wherein the switch modules are configured to form electrical connection between the conductive areas and the electrostatic discharge lines under an electrostatic voltage generated by electrostatic charges.

3. The OLED array substrate according to claim 1, wherein:
   the electrostatic discharge lines include first electrostatic discharge lines and second electrostatic discharge lines; and
   a conductive area is connected to a first electrostatic discharge line through first switch modules, and is connected to a second electrostatic discharge line through second switch modules.

4. The OLED array substrate according to claim 3, wherein:
   when positive electrostatic charges are generated in the conductive area and create a positive electrostatic voltage, the first switch modules are turned on; and
   when negative electrostatic charges are generated in the conductive area and create a negative electrostatic voltage, the second switch modules are turned on.

5. The OLED array substrate according to claim 3, wherein:
   a control terminal and a first terminal of the first switch module are connected to the conductive area; and a second terminal of the first switch module is connected to the first electrostatic discharge line.

6. The OLED array substrate according to claim 3, wherein:
   a control terminal and a first terminal of the second switch module are connected to the second electrostatic discharge line, and a second terminal of the second switch module is connected to the conductive area.

7. The OLED array substrate according to claim 5, wherein the first switch modules and the second switch modules are N-type transistors.

8. The OLED array substrate according to claim 3, wherein:
   a control terminal and a first terminal of the first switch module are connected to the first electrostatic discharge line, and a second terminal of the first switch module is connected to the conductive area.

9. The OLED array substrate according to claim 3, wherein:
   a control terminal and a first terminal of the second switch module are connected to the conductive area, and a second terminal of the second switch module is connected to the second electrostatic discharge line.

10. The OLED array substrate according to claim 9, wherein the first switch modules and the second switch modules are P-type transistors.

11. The OLED array substrate according to claim 1, wherein the switch module includes at least two cascaded transistors.

12. The OLED array substrate according to claim 1, further including gate lines and data lines arranged to be perpendicular to the gate lines, wherein:
    gate lines and data lines are connected to the second electrostatic discharge line through a first electrostatic discharge structure and are connected to the first electrostatic discharge line through a second electrostatic discharge structure.

13. An OLED display apparatus, including the OLED array substrate of claim 1.

14. A method for forming an OLED array substrate, including:
    forming switch modules electrically connected to conductive areas and electrostatic discharge lines; and
    forming, subsequently, a cathode of OLEDs in the array substrate,
    wherein at least one of the switch modules includes a transistor including a source terminal and a drain terminal, one of the source terminal and the drain terminal being connected to at least one of the conductive areas, and another one of the source terminal and the drain terminal being connected to at least one of the electrostatic discharge lines; the conductive areas are connected to the cathode such that during a process for forming the cathode of the OLEDs, electrostatic voltages generated by electrostatic charges in the conductive areas turn on the switch modules and the electrostatic charges are discharged through the electrostatic discharge lines.

15. An electrostatic discharge circuit for discharging electrostatic charges generated during a formation process of a cathode layer of an organic light-emitting diode (OLED) array substrate, including:
    electrostatic discharge lines;
    peripheral electrostatic discharge areas with conductive areas, the conductive areas being electrically connected to the cathode layer; and
    switch modules connecting the conductive areas and the electrostatic discharge lines;
    wherein at least one of the switch modules includes a transistor including a source terminal and a drain terminal, one of the source terminal and the drain terminal being connected to at least one of the conductive areas, and another one of the source terminal and the drain terminal being connected to at least one of the electrostatic discharge lines; and the electrostatic charges in the conductive areas are discharged through the switch modules and electrostatic discharge lines.

16. The electrostatic discharge circuit according to claim 15, wherein the switch modules are configured to be turned on by electrostatic voltages generated by electrostatic charges in the conductive areas such that the electrostatic charges are discharged through the electrostatic discharge lines.

* * * * *